United States Patent
Yoo et al.

(10) Patent No.: US 9,786,834 B2
(45) Date of Patent: Oct. 10, 2017

(54) EAP TRANSDUCERS WITH IMPROVED PERFORMANCE

(71) Applicant: Parker Hannifin Corporation, Cleveland, OH (US)

(72) Inventors: Mikyong Yoo, Palo Alto, CA (US); Xina Quan, Saratoga, CA (US)

(73) Assignee: PARKER-HANNIFIN CORPORATION, Cleveland, OH (US)

( * ) Notice: Subject to any disclaimer, the term of this patent is extended or adjusted under 35 U.S.C. 154(b) by 502 days.

(21) Appl. No.: 14/389,204

(22) PCT Filed: Apr. 12, 2013

(86) PCT No.: PCT/US2013/036312
§ 371 (c)(1),
(2) Date: Sep. 29, 2014

(87) PCT Pub. No.: WO2013/155377
PCT Pub. Date: Oct. 17, 2013

(65) Prior Publication Data
US 2015/0084483 A1    Mar. 26, 2015

Related U.S. Application Data

(60) Provisional application No. 61/623,112, filed on Apr. 12, 2012, provisional application No. 61/709,369, filed on Oct. 4, 2012.

(51) Int. Cl.
*H01L 41/193* (2006.01)
*F03G 7/08* (2006.01)
(Continued)

(52) U.S. Cl.
CPC ............. *H01L 41/193* (2013.01); *F03G 7/08* (2013.01); *H01L 41/0478* (2013.01);
(Continued)

(58) Field of Classification Search
USPC ........................................................ 310/800
See application file for complete search history.

(56) References Cited

U.S. PATENT DOCUMENTS

| 3,516,846 A | 6/1970 | Matson |
| 4,373,525 A | 2/1983 | Kobayashi |
(Continued)

FOREIGN PATENT DOCUMENTS

| CA | 2769441 A1 | 2/2011 |
| CN | 1447365 A | 10/2003 |
(Continued)

OTHER PUBLICATIONS

Biomimetic Products, Inc., hhtp://www.biomimetic.com, Jun. 6, 2001.
(Continued)

*Primary Examiner* — J. San Martin
(74) *Attorney, Agent, or Firm* — K&L Gates LLP

(57) ABSTRACT

The present invention provides electroactive polymer ("EAP") transducers having improved properties. This improvement is achieved without decreasing film thickness, or by using high dielectric constant and high field, so that this approach does not adversely affect the reliability and physical properties of the resultant dielectric films. Mobile electrically active additives are added to the electrode formulation which significantly improve the performance of electroactive polymer transducers. Such additives do not need to be ionic. These electrically active additives can enable higher performance devices, smaller devices using less active area, lower voltage/power operation, and combinations of these enhancements.

12 Claims, 18 Drawing Sheets

(51) Int. Cl.
*H01L 41/08* (2006.01)
*H03H 3/02* (2006.01)
*H01L 41/047* (2006.01)
*H01L 41/09* (2006.01)
*H01L 41/053* (2006.01)
*H01L 41/253* (2013.01)
*H01L 41/083* (2006.01)

(52) U.S. Cl.
CPC ...... *H01L 41/0533* (2013.01); *H01L 41/0805* (2013.01); *H01L 41/0986* (2013.01); *H01L 41/253* (2013.01); *H03H 3/02* (2013.01); *H01L 41/083* (2013.01); *Y10T 29/42* (2015.01)

(56) References Cited

U.S. PATENT DOCUMENTS

| | | | |
|---|---|---|---|
| 4,455,181 A | 6/1984 | Lifshin | |
| 4,561,830 A | 12/1985 | Bradley | |
| 4,594,058 A | 6/1986 | Fischell | |
| 4,671,792 A | 6/1987 | Borsanyi | |
| 4,728,265 A | 3/1988 | Cannon | |
| 4,808,084 A | 2/1989 | Tsubouchi et al. | |
| 5,048,791 A | 9/1991 | Ellison et al. | |
| 5,057,372 A | 10/1991 | Imfeld | |
| 5,103,211 A | 4/1992 | Daoud et al. | |
| 5,104,707 A | 4/1992 | Watanabe et al. | |
| 5,192,197 A | 3/1993 | Culp | |
| 5,217,355 A | 6/1993 | Hyman et al. | |
| 5,256,474 A | 10/1993 | Johnston | |
| 5,322,975 A | 6/1994 | Nagy et al. | |
| 5,630,709 A | 5/1997 | Bar-Cohen | |
| 5,637,421 A * | 6/1997 | Poehler | H01M 4/60 205/58 |
| 5,674,596 A | 10/1997 | Johnston | |
| 5,798,600 A | 8/1998 | Sager et al. | |
| 5,961,298 A | 10/1999 | Bar-Cohen et al. | |
| 5,964,583 A | 10/1999 | Danby | |
| 6,040,356 A | 3/2000 | Kanki et al. | |
| 6,074,179 A | 6/2000 | Jokela et al. | |
| 6,284,396 B1 | 9/2001 | Kaule | |
| 6,336,367 B1 | 1/2002 | Raisanen | |
| 6,524,675 B1 | 2/2003 | Mikami et al. | |
| 6,540,893 B1 | 4/2003 | Wakida et al. | |
| 6,544,664 B1 | 4/2003 | Takahashi | |
| 6,685,442 B2 | 2/2004 | Chinn et al. | |
| 6,702,916 B2 | 3/2004 | Smith | |
| 6,796,639 B2 | 9/2004 | Sugahara | |
| 6,807,729 B2 | 10/2004 | Kawashima et al. | |
| 6,876,125 B2 | 4/2005 | Basheer et al. | |
| 7,316,794 B2 | 1/2008 | O'Brien | |
| 7,344,763 B2 | 3/2008 | Kokeguchi et al. | |
| 7,353,747 B2 | 4/2008 | Swayze et al. | |
| 7,482,745 B2 | 1/2009 | Shirogane et al. | |
| 7,745,374 B2 | 6/2010 | Tanaka et al. | |
| 7,754,520 B2 | 7/2010 | Lee | |
| 7,772,745 B2 | 8/2010 | Kawakubo et al. | |
| 7,883,783 B2 | 2/2011 | Nagatani | |
| 7,911,761 B2 * | 3/2011 | Biggs | H01G 2/14 361/272 |
| 7,930,815 B2 | 4/2011 | Coleman et al. | |
| 7,958,789 B2 | 6/2011 | Hayakawa et al. | |
| 7,997,260 B2 | 8/2011 | Kaakkola et al. | |
| 8,007,986 B2 | 8/2011 | Zhang et al. | |
| 8,050,601 B2 | 11/2011 | Lin et al. | |
| 8,056,618 B2 | 11/2011 | Wagner et al. | |
| 8,667,849 B2 | 3/2014 | Sato et al. | |
| 8,679,575 B2 * | 3/2014 | Biggs | H01L 41/0986 427/58 |
| 8,773,373 B2 | 7/2014 | Sato et al. | |
| 2003/0168936 A1 | 9/2003 | Everingham et al. | |
| 2004/0035472 A1 | 2/2004 | Teltscher et al. | |
| 2004/0234401 A1 | 11/2004 | Banister | |
| 2004/0242956 A1 * | 12/2004 | Scorvo | A61F 2/0022 600/30 |
| 2005/0238506 A1 | 10/2005 | Mescher et al. | |
| 2006/0269664 A1 * | 11/2006 | Gleason | B05D 1/60 427/248.1 |
| 2008/0043318 A1 | 2/2008 | Whitesides et al. | |
| 2008/0248231 A1 | 10/2008 | Daigaku et al. | |
| 2008/0264441 A1 | 10/2008 | Takagi | |
| 2009/0028491 A1 | 1/2009 | Fillion et al. | |
| 2009/0050829 A1 | 2/2009 | Haynes et al. | |
| 2009/0104448 A1 | 4/2009 | Thompson et al. | |
| 2010/0006827 A1 | 1/2010 | Buckley | |
| 2010/0172011 A1 * | 7/2010 | Piroux | B32B 17/10036 359/268 |
| 2010/0273063 A1 * | 10/2010 | Wallace | H01G 9/022 429/317 |
| 2011/0085284 A1 * | 4/2011 | Micallef | H01G 9/155 361/502 |
| 2011/0216389 A1 * | 9/2011 | Piroux | G02F 1/15 359/268 |
| 2011/0222138 A1 * | 9/2011 | Piroux | C09K 9/02 359/268 |
| 2012/0126959 A1 | 5/2012 | Zarrabi et al. | |
| 2012/0307338 A1 * | 12/2012 | Solarski | C09K 9/02 359/245 |
| 2013/0176628 A1 * | 7/2013 | Batchko | G02B 3/12 359/665 |
| 2015/0119529 A1 * | 4/2015 | Laurino | H01B 1/125 525/327.2 |
| 2016/0025429 A1 | 1/2016 | Muir et al. | |
| 2016/0204338 A1 | 7/2016 | Schmeer et al. | |
| 2016/0208944 A1 | 7/2016 | Muir et al. | |
| 2016/0230904 A1 | 8/2016 | Zarrabi et al. | |

FOREIGN PATENT DOCUMENTS

| | | |
|---|---|---|
| EP | 0154473 B1 | 5/1992 |
| FR | 2208461 A5 | 6/1974 |
| JP | 2000-331874 A | 11/2000 |
| JP | 2001-291906 A | 10/2001 |
| JP | 2002-503008 A | 1/2002 |
| JP | 2004-205827 A | 7/2004 |
| JP | 2005-001885 A | 1/2005 |
| JP | 2005-260236 A | 9/2005 |
| JP | 2008-277729 A | 11/2008 |
| JP | 2009-077618 A | 4/2009 |
| TW | I269615 B | 12/2006 |
| TW | I272194 B | 2/2007 |
| WO | WO 2006/071419 A2 | 7/2006 |
| WO | WO 2007/018877 A2 | 2/2007 |
| WO | WO 2008/039658 A2 | 4/2008 |
| WO | WO 2009/056497 A1 | 5/2009 |
| WO | WO 2010/054014 A1 | 5/2010 |
| WO | WO 2011/097020 A2 | 8/2011 |
| WO | WO 2012/032437 A1 | 3/2012 |
| WO | WO 2013/044195 A2 | 3/2013 |
| WO | WO 2015/020698 A2 | 2/2015 |
| WO | WO 2015/126928 A1 | 8/2015 |
| WO | WO 2015/126928 A4 | 12/2015 |

OTHER PUBLICATIONS

Gardner, J.W., "Microsensors: Principles and Applications," John Wiley, 1994. (Book—not attached).

Kornbluh, R., "Description of Children's Tour," Aug. 20, 2000.

Nguyen, T., Green, M., and Kornbluh, R., "Robotic Systems," in ONR Ocean, Atmosphere, and Space Fiscal Year 2000 Annual Reports (Jan. 2001). (Cited in now U.S. Pat. No. 7,211,937 however, unable to locate).

Pelrine et al., "Electrostrictive Polymer Artificial Muscle Actuators," May 1998, Proc. Of the 1998 IEEE Conf. on Robotics & Automation, pp. 2147-2154.

Prahlad, H. et al., "Programmable Surface Deformation: Thickness-Mode Electroactive Polymer Actuators and their Applications," Proc. SPIE, vol. 5759, 102, 2005, 12 pages.

Seoul et al., "Electrospinning of Poly(vinylidene fluoride) Dimethylformamide Solutions with Carbon Nanotubes," Department of Textile Engineering, Inha University, Mar. 31, 2003.

(56) References Cited

OTHER PUBLICATIONS

Kornbluh, R., R. Pelrine, Q. Pei, and V. Shastri "Electroactive Polymer (EAP) Actuators as Artificial Muscles—Reality, Potential and Challenges", Chapter 16, Application of Dielectric EAP Actuators, SPIE Press, May 2001.
Polyoxymethylene urea NPL document, retrieved Nov. 11, 2015.

* cited by examiner

Stroke $\alpha\ \varepsilon E^2/Y$

Force $\alpha\ \varepsilon E^2/t$

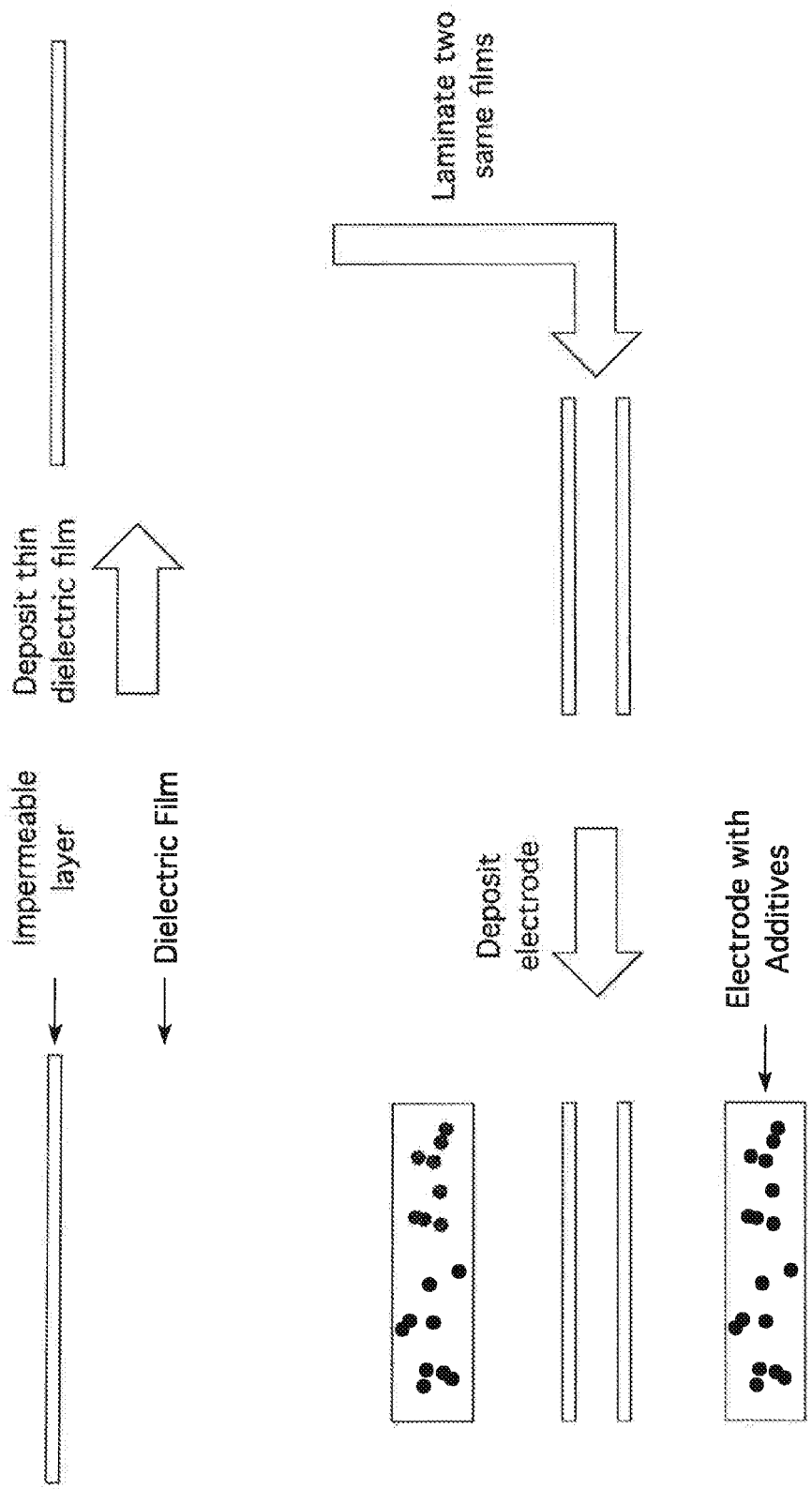

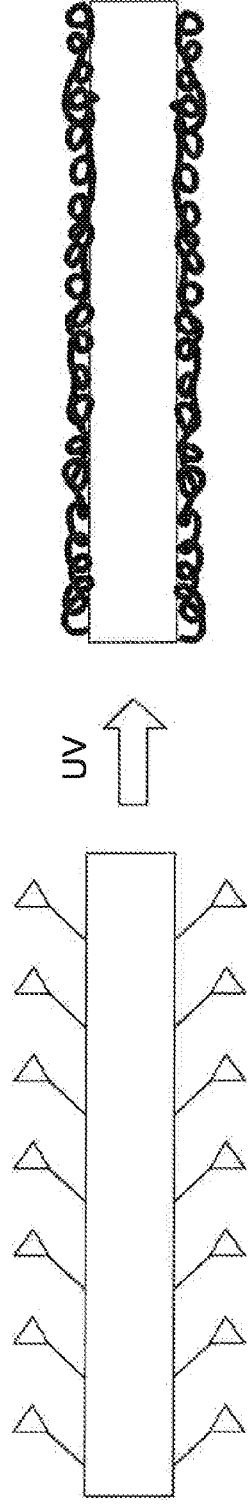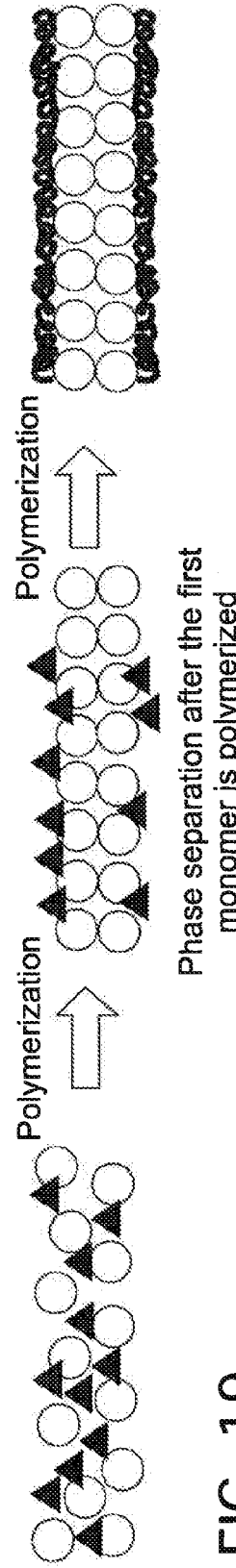

- Use plasma to make a thin dense layer
- Dielectric film is modified with functional group that can be polymerized with UV, leading to a dense structure

- Use differences in diffusion, polymerization rate and phase separation; the first monomer is polymerized first and second monomer, which can form less permeable layer, is phase- separated out to surface and polymerized. Alternatively the second monomer can be imbibed or deposited on the surface of the dielectric film before polymerization. An approach similar to those used to make plastic graded index lenses and optical fibers can be used. http://shodhganga.inflibnet.ac.in/bitstream/10603/2830/8/08_chapter%202.pdf

FIG. 19

EAP TRANSDUCERS WITH IMPROVED PERFORMANCE

RELATED APPLICATION

This application is the U.S. National Stage application filed under 35 U.S.C. §371(c) of International Application No. PCT/US2013/036312 that claims the benefit, under 35 USC §119(e), of U.S. Provisional Application No. 61/623,112 filed Apr. 12, 2012 entitled "EAP TRANSDUCERS WITH IMPROVED PERFORMANCE"; and U.S. Provisional Application No. 61/709,369 filed Oct. 4, 2012 entitled "EAP TRANSDUCERS WITH IMPROVED PERFORMANCE" the entireties of which are incorporated herein by reference.

FIELD OF THE INVENTION

The present invention relates in general to electroactive polymers and more specifically to manufacturing processes for producing electroactive polymer ("EAP") transducers with improved performance.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of device may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers", for the fabrication of transducers. These considerations include potential force, power density, power conversion/consumption, size, weight, cost, response time, duty cycle, service requirements, environmental impact, etc. As such, in many applications, electroactive polymer technology offers an ideal replacement for piezoelectric, shape-memory alloy and electromagnetic devices such as motors and solenoids.

An electroactive polymer transducer comprises two electrodes having deformable characteristics and separated by a thin elastomeric dielectric material. When a voltage difference is applied to the electrodes, the oppositely charged electrodes attract each other thereby compressing the polymer dielectric layer therebetween. As the electrodes are pulled closer together, the dielectric polymer film becomes thinner (the Z-axis component contracts) as it expands in the planar directions (along the X- and Y-axes), i.e., the displacement of the film is in-plane. The electroactive polymer film may also be configured to produce movement in a direction orthogonal to the film structure (along the Z-axis), i.e., the displacement of the film is out-of-plane. U.S. Pat. No. 7,567,681 discloses electroactive polymer film constructs which provide such out-of-plane displacement—also referred to as surface deformation or as thickness mode deflection.

The material and physical properties of the electroactive polymer film may be varied and controlled to customize the deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), the tension or pre-strain placed on the electroactive polymer film as a whole, and the amount of voltage applied to or capacitance induced upon the film may be controlled and varied to customize the features of the film when in an active mode.

Numerous applications exist that benefit from the advantages provided by such electroactive polymer films whether using the film alone or using it in an electroactive polymer actuator. One of the many applications involves the use of electroactive polymer transducers as actuators to produce haptic feedback (the communication of information to a user through forces applied to the user's body) in user interface devices. There are many known user interface devices which employ haptic feedback, typically in response to a force initiated by the user. Examples of user interface devices that may employ haptic feedback include keyboards, keypads, game controller, remote control, touch screens, computer mice, trackballs, stylus sticks, joysticks, etc. The user interface surface can comprise any surface that a user manipulates, engages, and/or observes regarding feedback or information from the device. Examples of such interface surfaces include, but are not limited to, a key (e.g., keys on a keyboard), a game pad or buttons, a display screen, etc.

The haptic feedback provided by these types of interface devices is in the form of physical sensations, such as vibrations, pulses, spring forces, etc., which a user senses either directly (e.g., via touching of the screen), indirectly (e.g., via a vibrational effect such as when a cell phone vibrates in a purse or bag pocket) or otherwise sensed (e.g., via an action of a moving body that creates a pressure disturbance sensed by the user). The proliferation of consumer electronic media devices such as smart phones, personal media players, portable computing devices, portable gaming systems, electronic readers, etc., can create a situation where a sub-segment of customers would benefit or desire an improved haptic effect in the electronic media device. However, increasing haptic capabilities in every model of an electronic media device may not be justified due to increased cost or increased profile of the device. Moreover, customers of certain electronic media devices may desire to temporarily improve the haptic capabilities of the electronic media device for certain activities.

Increasing use of electroactive polymer transducers in consumer electronic media devices as well as the numerous other commercial and consumer applications highlights the need to provide electroactive polymer transducers with improved performance.

SUMMARY OF THE INVENTION

Accordingly, the present invention provides electroactive polymer ("EAP") transducers having improved properties. This improvement is achieved without decreasing film thickness or by increasing dielectric constant or applied electric field, so that this approach does not adversely affect the reliability and physical properties of the resultant dielectric films.

Mobile, electrically active additives added to the electrode formulation can significantly improve the performance of electroactive polymer transducers. Such additives do not need to be ionic. Use of these electrically active additives can enable higher performance devices, smaller devices using less active area, lower voltage/power operation, and combinations of these enhancements. Although not wishing to be bound to any particular theory, the present inventors speculate that a portion of these electrically active additives diffuse into the dielectric layer. These diffusants may chemically interact with the functional groups of the dielectric layer material, particularly after photo- or thermal exposure. Chemical modifications of the dielectric film to increase interaction between the polymer matrix and the electrically active additives could enhance performance and long-term stability. The presence and diffusion of the electrically active additives and their fragments can be tracked through chemical analyses such as FTIR-ATR, NMR, and Raman mapping. The diffusivity of the electrically active additives and their fragments may relate to molecular size and also to their charge or induced charge. The electrically active additives and their fragments may have functional groups that can react or interact with the dielectric matrix to limit their diffusivity. This can enable the creation of permanent concentration gradients in the dielectric layer which may enhance performance.

Changes in device design such as encapsulation to modify electrically active additive diffusion and improved buss lines to reduce resistive heating can mitigate performance degradation that may occur on aging or cyclic operation and enhance long-term stability. Operation at lower electrical fields or with dwell times between operations may also improve long-term performance.

These and other advantages and benefits of the present invention will be apparent from the Detailed Description of the Invention herein below.

BRIEF DESCRIPTION OF THE FIGURES

The present invention will now be described for purposes of illustration and not limitation in conjunction with the figures, wherein:

FIG. 18 details how to make multilayer having an impermeable dielectric film;

FIG. 19 illustrates methods to make an impermeable layer; and

DETAILED DESCRIPTION OF THE INVENTION

Figure 1:
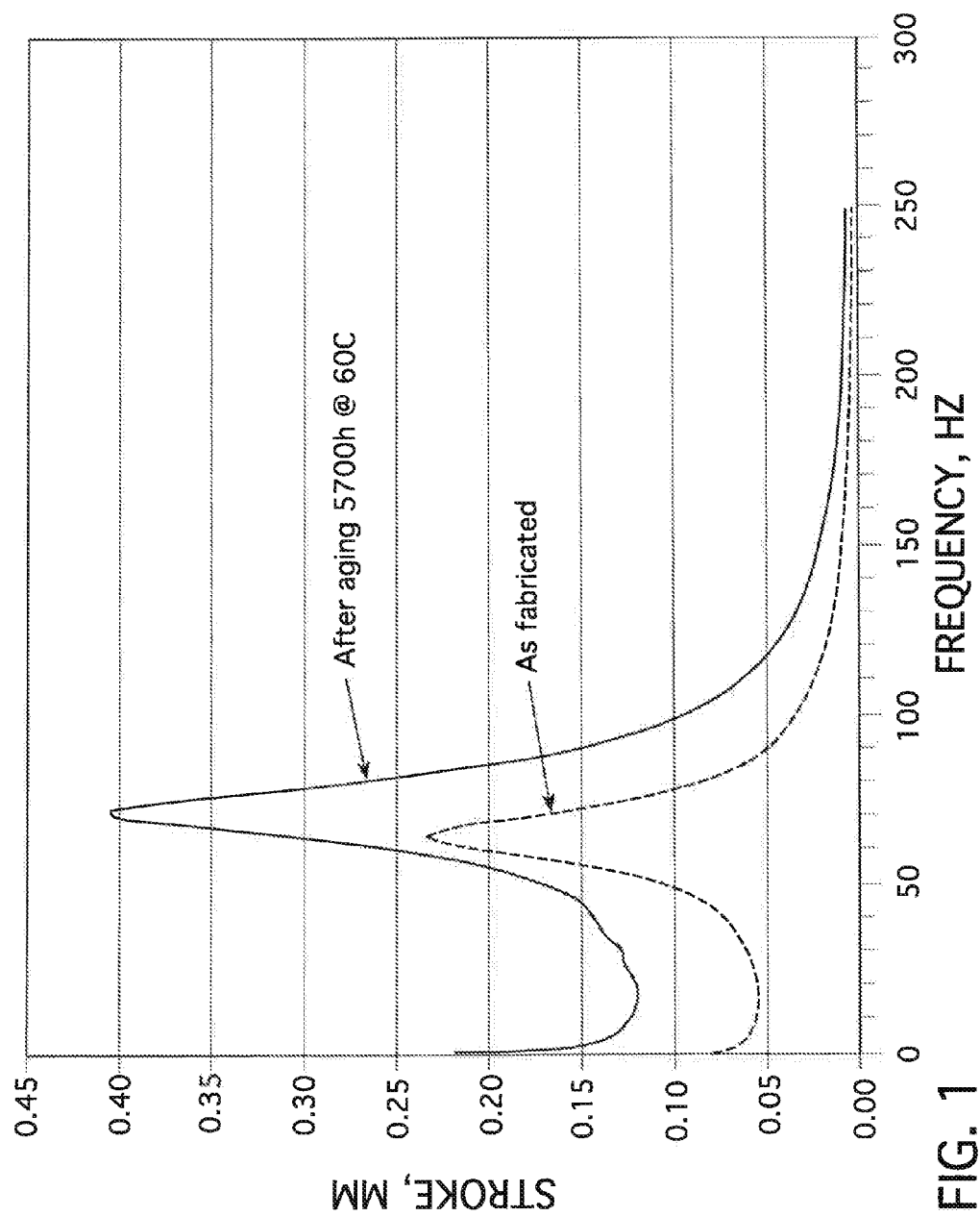
FIG. 1 shows the pulse response at 75 Hz for a frameless dielectric elastomer device before and after aging for 5700 hours at 60° C.

Examples of electroactive polymer devices and their applications are described, for example, in U.S. Pat. Nos. 6,343,129; 6,376,971; 6,543,110; 6,545,384; 6,583,533; 6,586,859; 6,628,040; 6,664,718; 6,707,236; 6,768,246; 6,781,284; 6,806,621; 6,809,462; 6,812,624; 6,876,135; 6,882,086; 6,891,317; 6,911,764; 6,940,221; 7,034,432; 7,049,732; 7,052,594; 7,062,055; 7,064,472; 7,166,953; 7,199,501; 7,199,501; 7,211,937; 7,224,106; 7,233,097; 7,259,503; 7,320,457; 7,362,032; 7,368,862; 7,378,783; 7,394,282; 7,436,099; 7,492,076; 7,521,840; 7,521,847; 7,567,681; 7,595,580; 7,608,989; 7,626,319; 7,750,532; 7,761,981; 7,911,761; 7,915,789; 7,952,261; 8,183,739; 8,222,799; 8,248,750; and in U.S. Patent Application Publication Nos.; 2007/0200457; 2007/0230222; 2011/0128239; and 2012/0126959, the entireties of which are incorporated herein by reference.

The present invention provides a transducer film comprising a dielectric elastomer material, an electrode material on at least one side of the dielectric elastomer material, and at least one electrically active additive.

Many variations are within the scope of this disclosure, for example, in variations of the device, the electroactive polymer transducers can be implemented to move a mass to produce an inertial haptic sensation. Alternatively, the electroactive polymer transducer can produce movement in an electronic media device when coupled to the assembly described herein. Electroactive transducers manufactured with the processes disclosed here can be used as actuators, generators, or sensors in many other applications including, without limitation, fluid handling systems, motion control, adaptive optical devices, vibration control systems, and energy harvesting systems.

In any application, the displacement created by the electroactive polymer transducer can be exclusively in-plane which is sensed as lateral movement, or can be out-of-plane (which is sensed as vertical displacement). Alternatively, the electroactive polymer transducer material may be segmented to provide independently addressable/movable sections so as to provide angular displacement of the housing or electronic media device or combinations of other types of displacement. In addition, any number of electroactive polymer transducers or films (as disclosed in the applications and patent listed herein) can be incorporated in devices such as user interface devices.

The electroactive polymer transducer may be configured to displace due to an applied voltage, which facilitates programming of a control system used with devices such as tactile feedback devices. Electroactive polymer transducers are ideal for such applications for a number of reasons. For example, because of their light weight and minimal components, electroactive polymer transducers offer a very low profile and, as such, are ideal for use in sensory/haptic feedback applications.

An electroactive polymer transducer comprises two thin film electrodes having elastic characteristics and separated by a thin elastomeric dielectric material. When a voltage difference is applied to the electrodes, the oppositely-charged electrodes attract each other thereby compressing the polymer dielectric layer therebetween. As the electrodes are pulled closer together, the dielectric polymer film becomes thinner (the z-axis component contracts) as it expands in the planar directions (the x- and y-axes components expand).

Figure 3:
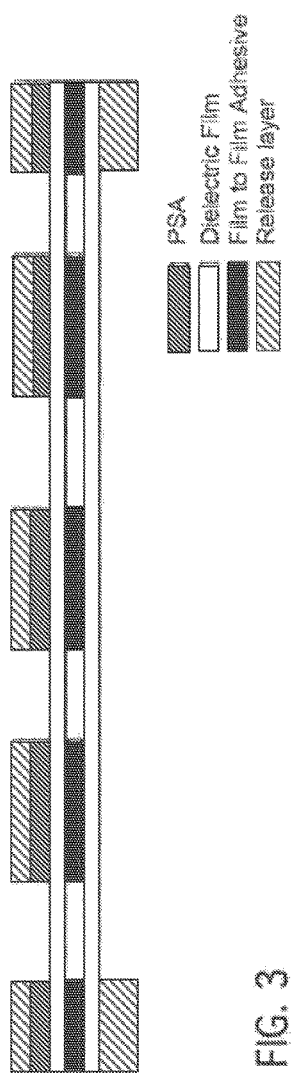
FIG. 3 illustrates a cross section of a frameless dielectric elastomer device.

It is noted that the figures discussed herein schematically illustrate exemplary configurations of devices that employ electroactive polymer films or transducers having such electroactive polymer films. FIG. 3, for example, depicts such a device that includes two dielectric films, a film to film adhesive layer between the dielectric films, a PSA layer, and a pair of release layers. Films useful in the present invention include, but are not limited to those made from polymers such as silicone, polyurethane, acrylate, hydrocarbon rubber, olefin copolymer, polyvinylidene fluoride copolymer, fluoroelastomer, styrenic copolymer, and adhesive elastomer.

In general, the performance of an electroactive polymer transducer, e.g. the induced strain change (s), may be improved by increasing the Maxwellian pressure on the dielectric (p)—accomplished by increasing the dielectric constant of dielectric film ($\in$) or by increasing electrical field (through decreasing film thickness (t) and/or increasing applied voltage (V))—or by decreasing the modulus of film (Y) as described by the electrostatic model of actuation:

$$s = -p/Y = -\in_o \in (V/t)^2/Y$$

The present invention provides electroactive polymer transducers with highly improved performance. This is achieved without decreasing film thickness, increasing dielectric constant, or using higher electric fields so that this approach does not affect the reliability or physical properties of dielectric films.

To increase dielectric constant ($\in$) of dielectric film, filler-polymer composites or functionality modification have been tried. This method can result in the increase in dielectric constant but generally causes an increase in modulus and decrease in dielectric breakdown strength, so that the resulted strain change (s) may increase very little. Decreasing the film thickness (t) and modulus (Y) can cause handling and yield issues in the manufacturing of film and devices, and because the modulus impacts the resonant frequency there is a limit to lowering the modulus for haptic application. Finally, high voltage can cause reliability issues for devices.

The present invention enables the improvement of electroactive polymer transducers by including an electrically active additive which does not affect the design of the electroactive polymer transducer or the manufacturability of the dielectric film. It can increase the performance by up to a factor of three over the same material construction without the electrically active additive. The performance improvement can be even greater depending on the concentration and the type of electrically active additive. This improvement also enables a significant decrease in operating voltage for the same transducer without the electrically active additive.

Figure 2:
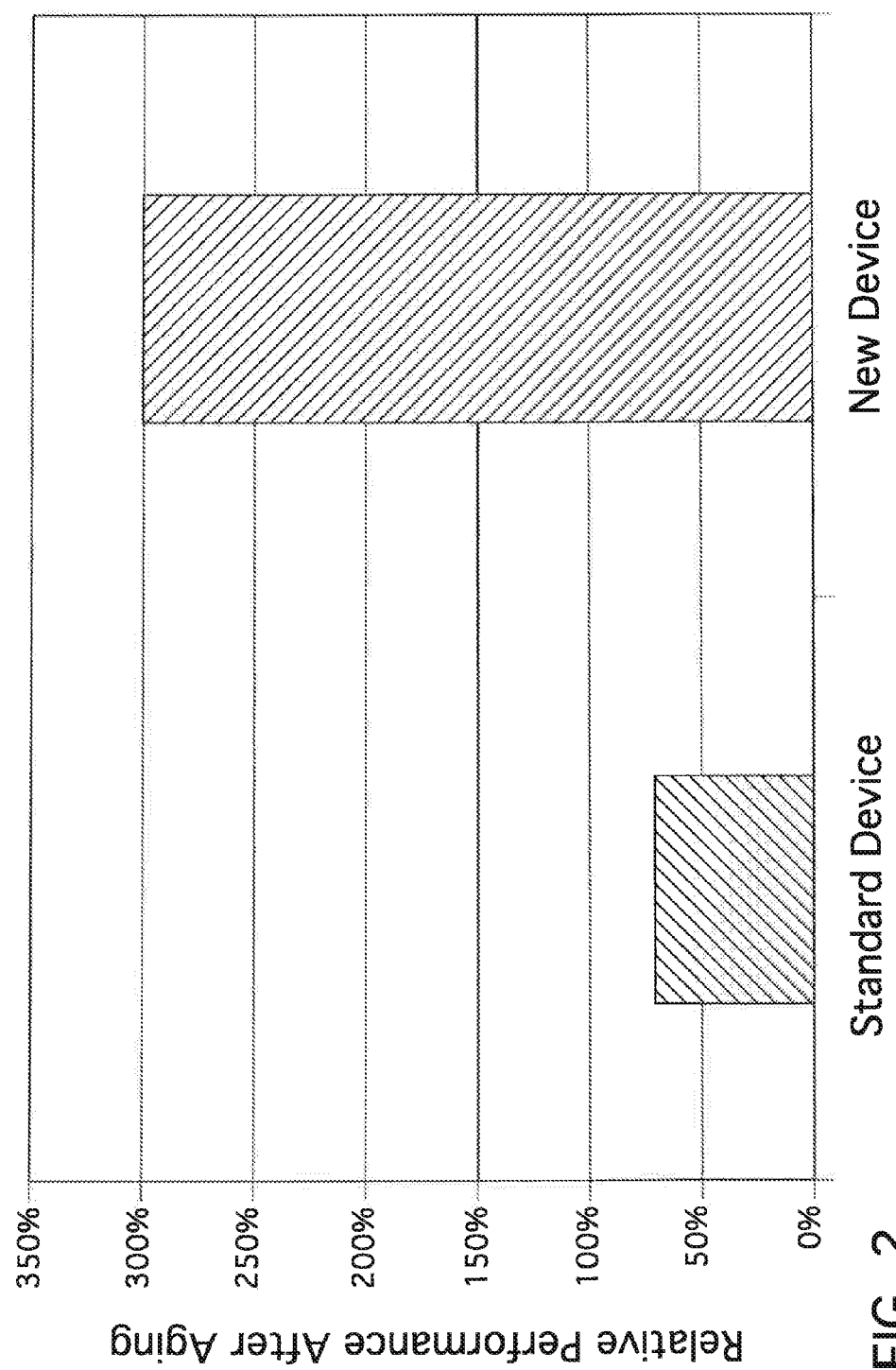
FIG. 2 compares relative performance of a frameless dielectric elastomer device before and after aging.

FIG. 1 illustrates the pulse response at 75 Hz for a frameless device before and after aging for 5700 hours at 60° C. The unexpected result was that performance had almost doubled after aging. The performance of a standard frameless device is generally reduced after aging as shown in FIG. 2.

Figure 4:
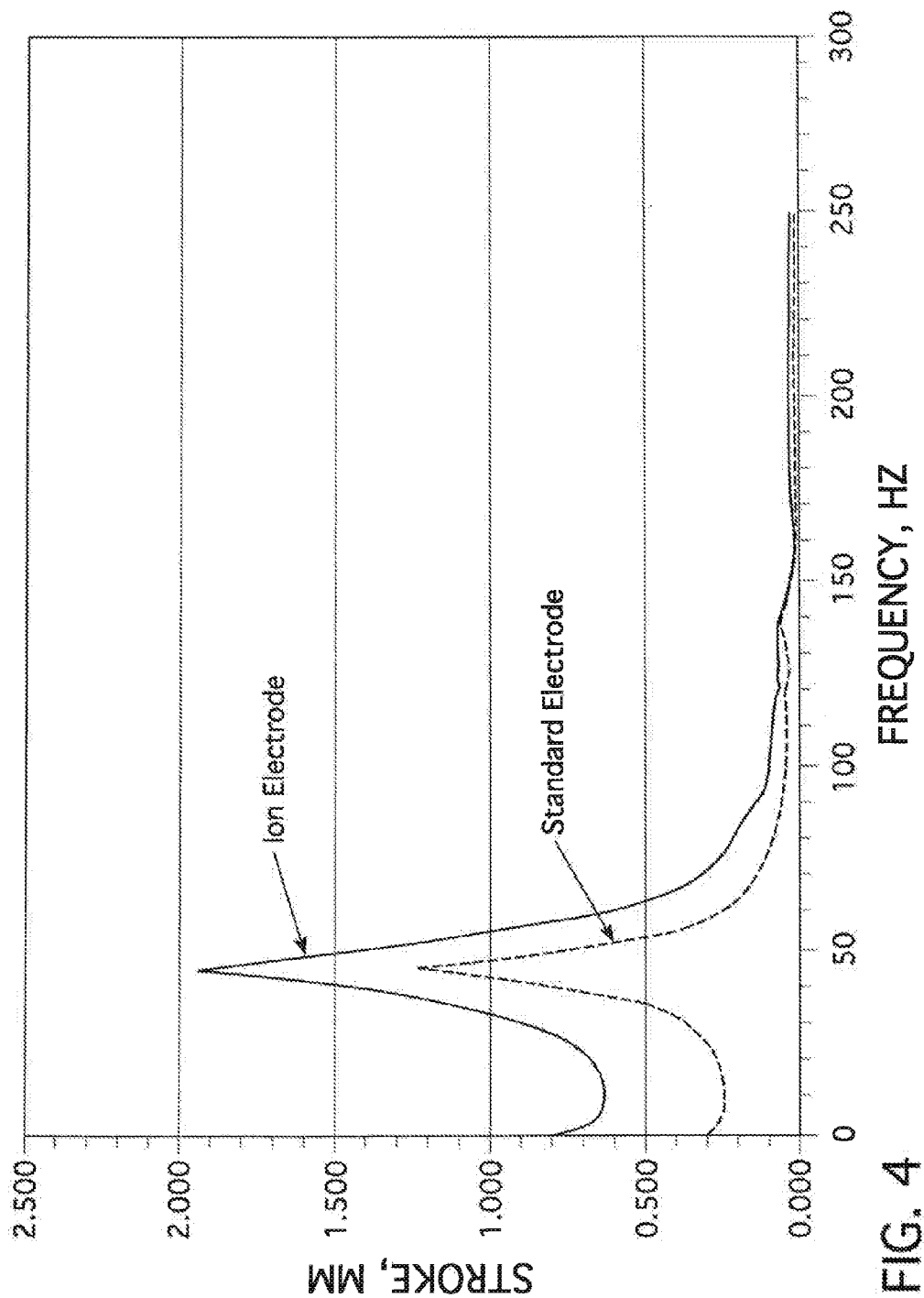
FIG. 4 compares the performance (stroke vs. frequency) of an enhanced electrode and a standard electrode.
Figure 5:
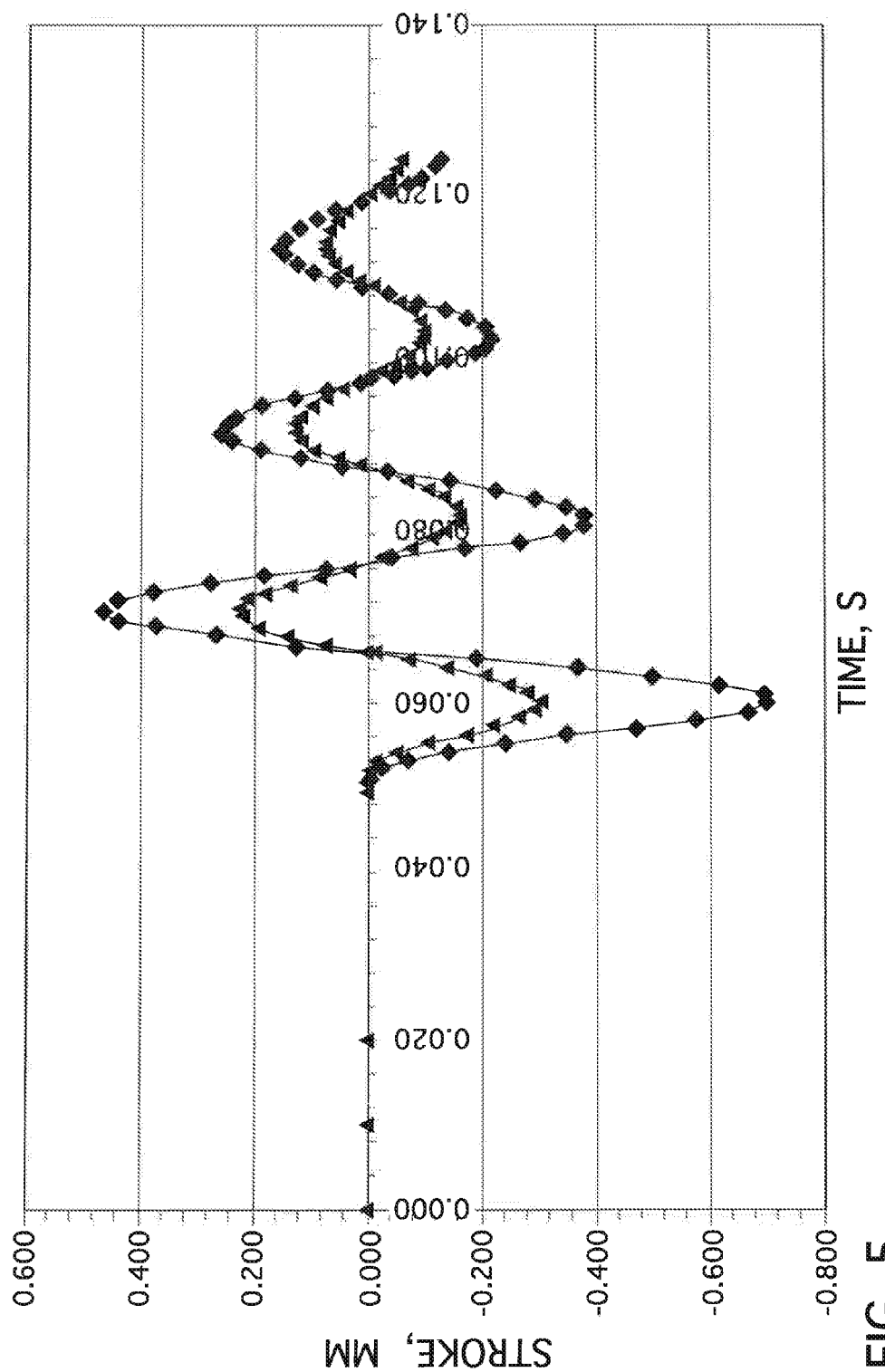
FIG. 5 compares the performance (stroke vs. time) of an enhanced electrode and a standard electrode.

This result was attributed to the addition of the 4-isopropyl-4'-methyldiphenyliodonium tetrakis(pentafluorophenyl) borate (I-3), an electrically active additive, to one component of the transducer. To test this hypothesis, an enhanced electrode was constructed by dissolving electrically active additive I-3 in ethyl acetate by 10 wt %; adding the solution to an electrode formulation by 1 part to 100 parts electrode (total solid concentration of electrically active additive I-3=0.1 wt % to electrode); printing the electrode and curing it at 150° C. for 4 minutes. The response of the transducer so constructed is shown in FIG. 4 with an applied field of 1 kV. As can be appreciated by reference to FIG. 4, there was an approximately 2× improvement as a result of adding the photoinitiator molecule. FIG. 5 compares performance of the enhanced electrode over time at 1 kV. The diamonds (◆) are the enhanced electrode values and the triangles (▲) are the standard electrode values. Again, an approximately 2× improvement was seen as a result of adding the electrically active additive I-3. Other candidate electrically active additives which exhibit a similar effect have been identified and evaluated.

Figure 6:
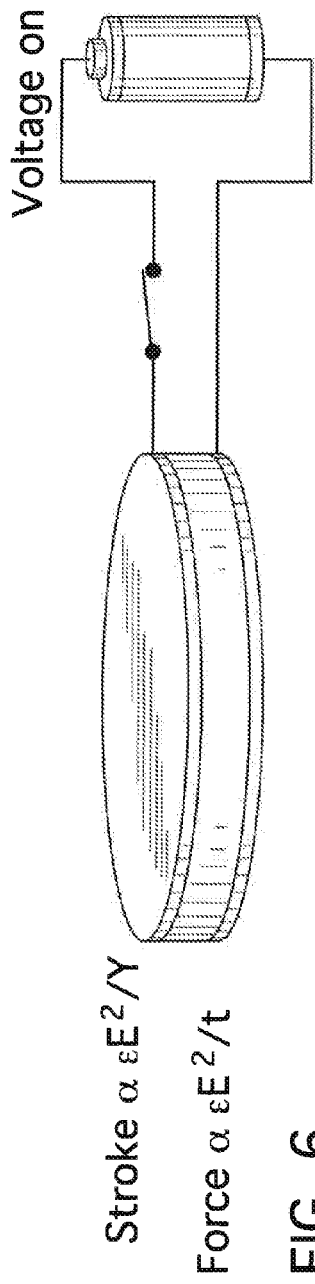
FIG. 6 illustrates the dependency of force upon the thickness of a film.

As shown in FIG. 6, transducer performance is dependent upon the thickness of the dielectric film. Without wishing to be held to a specific theory, the present inventors hypothesized that upon the use of an applied voltage, portions of the electrically active additive separate and align along either side of the silicone substrate, essentially decreasing the thickness of the dielectric layer, increasing the effective applied electric field, and driving up the performance of the EAP device. This mechanism is shown schematically in FIG. 13. Ideally the depletion layer should be kept constant; no change with the field. This will provide reliability and a quick response time after the field is removed and reapplied. The thinner the depletion layer, the higher the performance. The electrically active additive and/or its fragments may also have an effect on the dielectric constant of the overall material.

Although small molecule salts, such as NaCl, have been shown to improve performance, some embodiments of the present invention include the use of relatively large, heavy ion salts as the electrically active additive for improving the performance of electroactive polymer transducers. The size of the electrically active additive or its fragments can impact the diffusion kinetics which leads to the formation and expansion of the depletion layer which leads to the enhanced performance. The large ions used in the present invention enable a good balance between the rapid formation of the depletion layer and the maximum lifetime of the depletion layer.

Additives containing iodonium salts, sulfonium salts and phthalocyanines are particularly preferred as electrically active additives in the present invention. As iodonium salts, the following may be mentioned, phenyl iodonium hexafluorophosphate, diphenyl iodonium hexafluoroantimonate, diphenyl iodonium tetrafluoroborate, diphenyl iodonium tetrakis(pentafluorophenyl)borate, bis(dodecylphenyl)iodonium hexafluorophosphate, bis-(dodecylphenyl) iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methyl-ethyl)phenyl iodonium hexafluorophosphate, 4-methylphenyl-4-(1-methylethyl)phenyl iodonium hexafluoroantimonate, 4-methylphenyl-4-(1-methylethyl) phenyl iodonium tetrafluoroborate, and 4-methylphenyl-4-(1-methylethyl)phenyl iodonium tetrakis(pentafluorophenyl)borate.

As a sulfonium salt, examples include, but are not limited to, bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfidebistctrafluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di-(4-(2-hydroxyethoxy))phenylsulfonio)phenyl]sulfide bishexafluorophosphate, bis[4-(di-(4-(2-hydroxyethoxy))phenylsulfonio)phenyl]sulfide bishexafluoroantimonate, bis[4-(di-(4-(2-hydroxyethoxy))phenylsulfonio)phenyl]sulfidebistetrafluoroborate, and bis[4-(di-(4-(2-hydroxyethoxy))phenylsulfonio)phenyl]sulfide tetrakis(pentafluoro-phenyl)borate, tris({4-[(4-acetylphenyl)sulfanyl]phenyl})sulfanium hexafluorophosphate (commercially available from BASF as IRGACURE PAG270), tris((4-[(4-acetylphenyl)sulfanyl]phenyl))sulfanium tetrakis(pentafluorophenyl)borate (commercially available from BASF as IRGACURE PAG290).

The electrically active additive examined herein include ionic photoinitiators such as (4-tert-Butylphenyl)diphenyl sulfonium triflate (Formula 4-isopropyl-4'-methyldiphenyliodonium tetrakis(pentafluorophenyl)borate (Formula I-3);

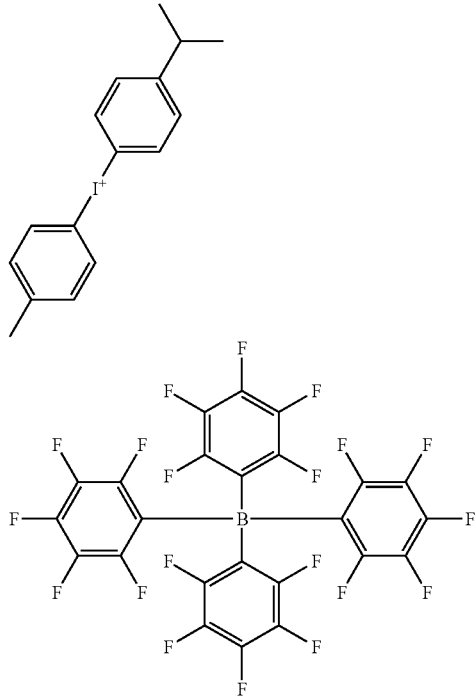

Sodium tetraphenylborate (Formula I-4);

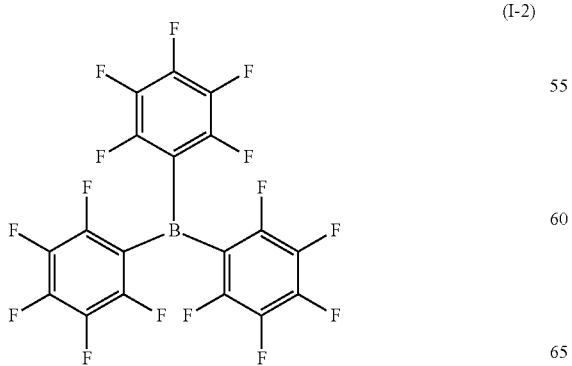

Tris(pentafluorophenyl) boron (Formula I-2) which is an example of a non-ionic compound;

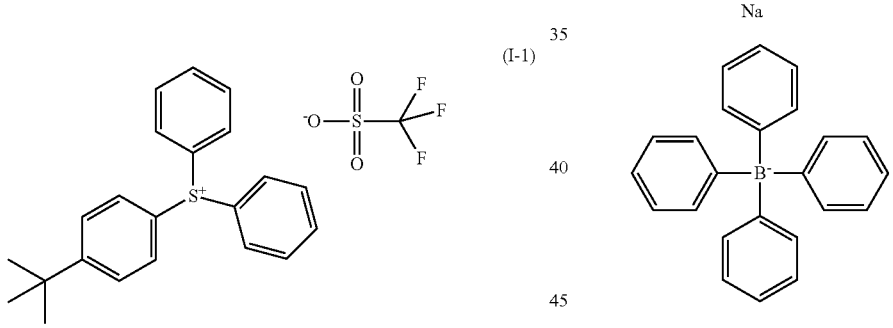

sodium tetrakis[3,5-bis(trifluoromethyl)phenyl]borate (Formula I-5);

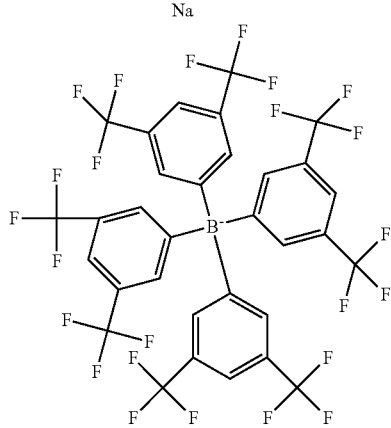

bis(4-tert-butylphenyl)iodonium triflate (Formula I-6);

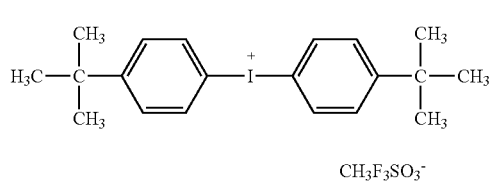

I-6

CH$_3$F$_3$SO$_3^-$ tris({4-[(4-acetylphenyl)sulfanyl]phenyl})sulfanium hexafluorophosphate (I-7)

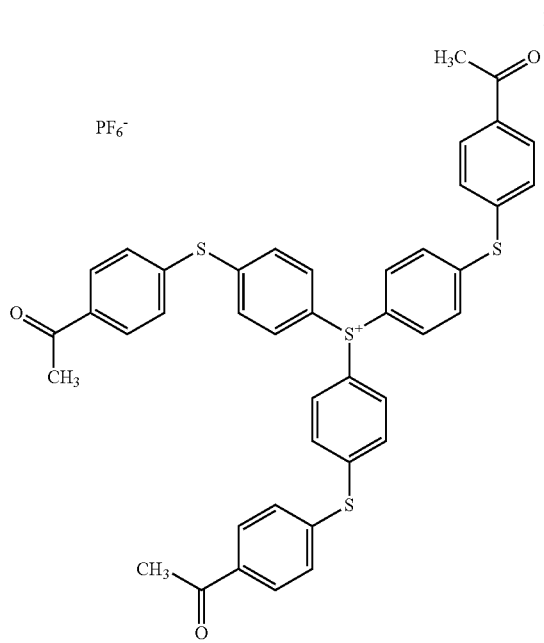

I-7 tris({4-[(4-acetylphenyl)sulfanyl]phenyl})sulfanium tetrakis(pentafluorophenyl) borate (I-8):

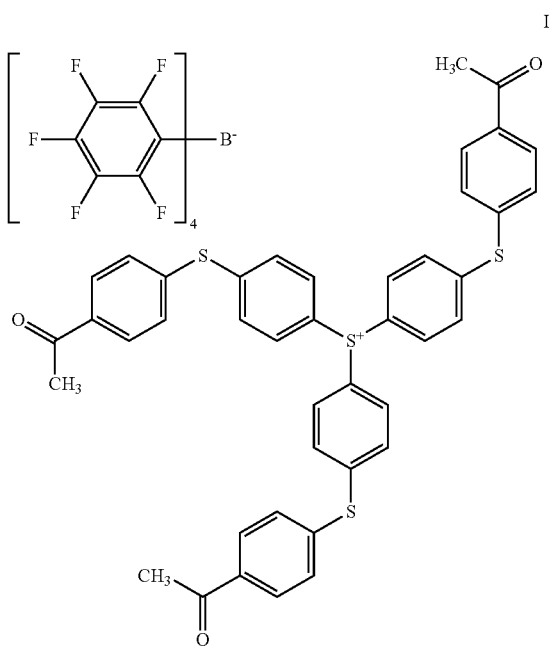

I-8

Phthalocyanine additives include Direct Blue 199 (I-9).

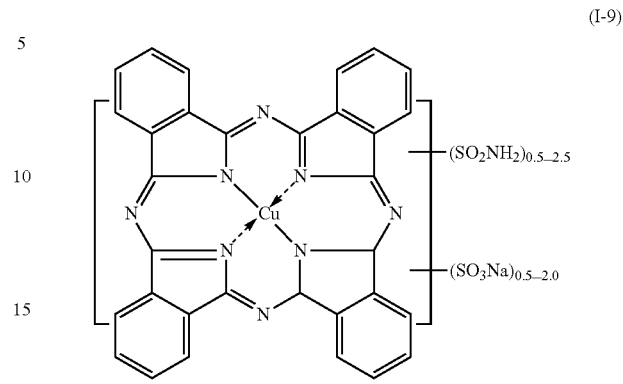

(I-9)

In some embodiments, mixtures of electrically active additives can be used to balance performance, time response, and long-term stability as needed for a particular application. Also, many of these compounds are photo- and thermally labile, and in some embodiments, the transducer film may be photo- or thermally treated to release fragments that are more effective as electrically active additives or that may react with functional groups in the dielectric matrix material. In some embodiments, the photo- or thermal treatment may be used to create permanent compositional gradients within the dielectric layer to reduce diffusional effects.

Figure 7:
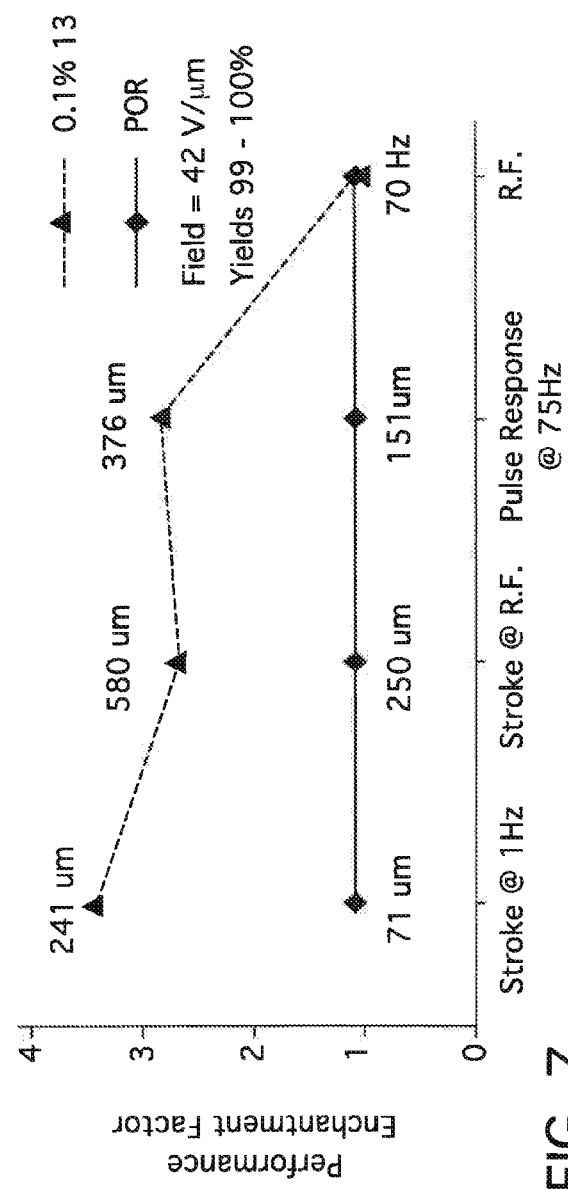
FIG. 7 is a graph showing improved performance of devices made by the inventive methods.
Figure 8:
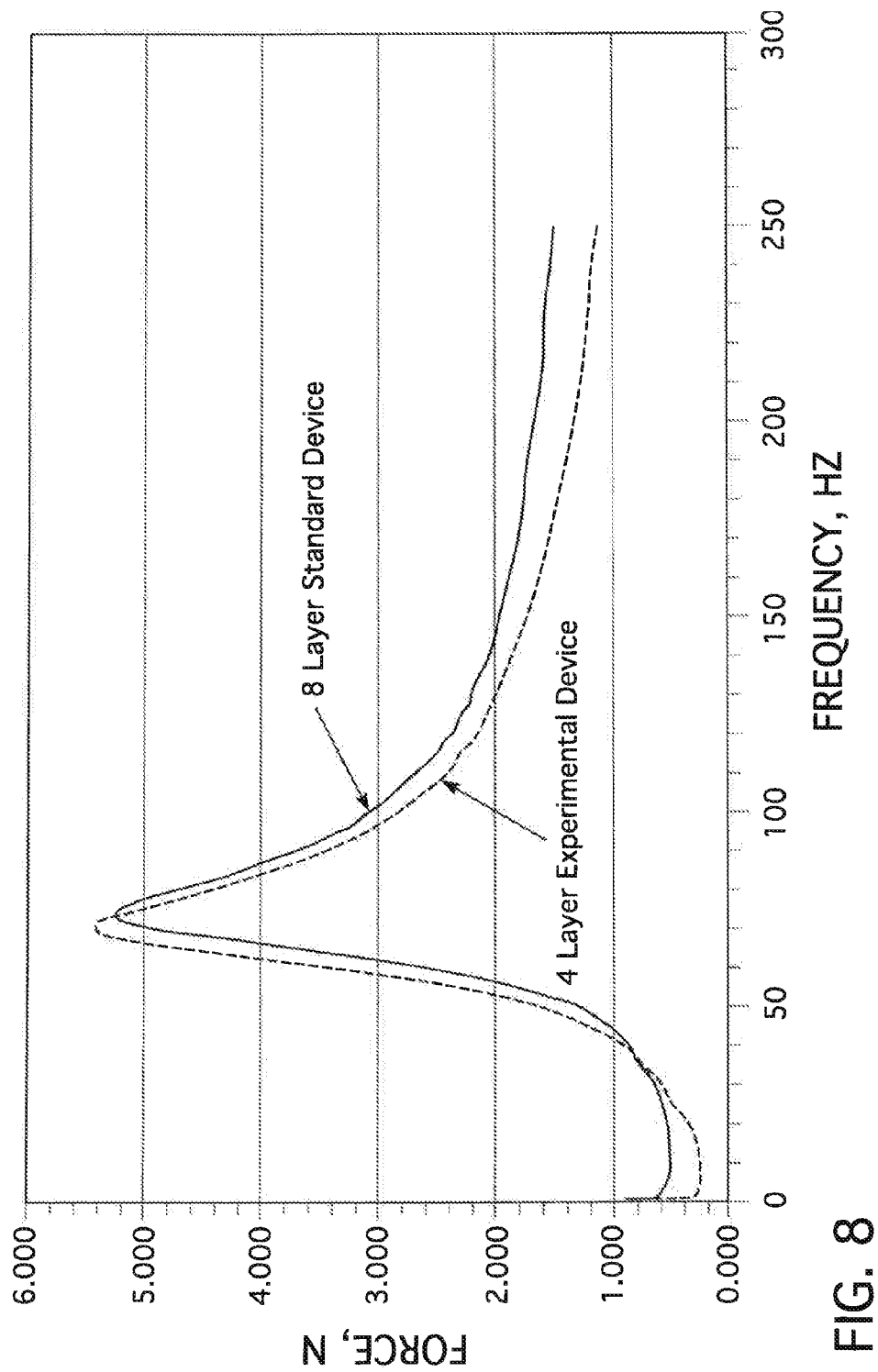
FIG. 8 illustrates the smaller active area of devices made by the inventive methods.
Figure 9:
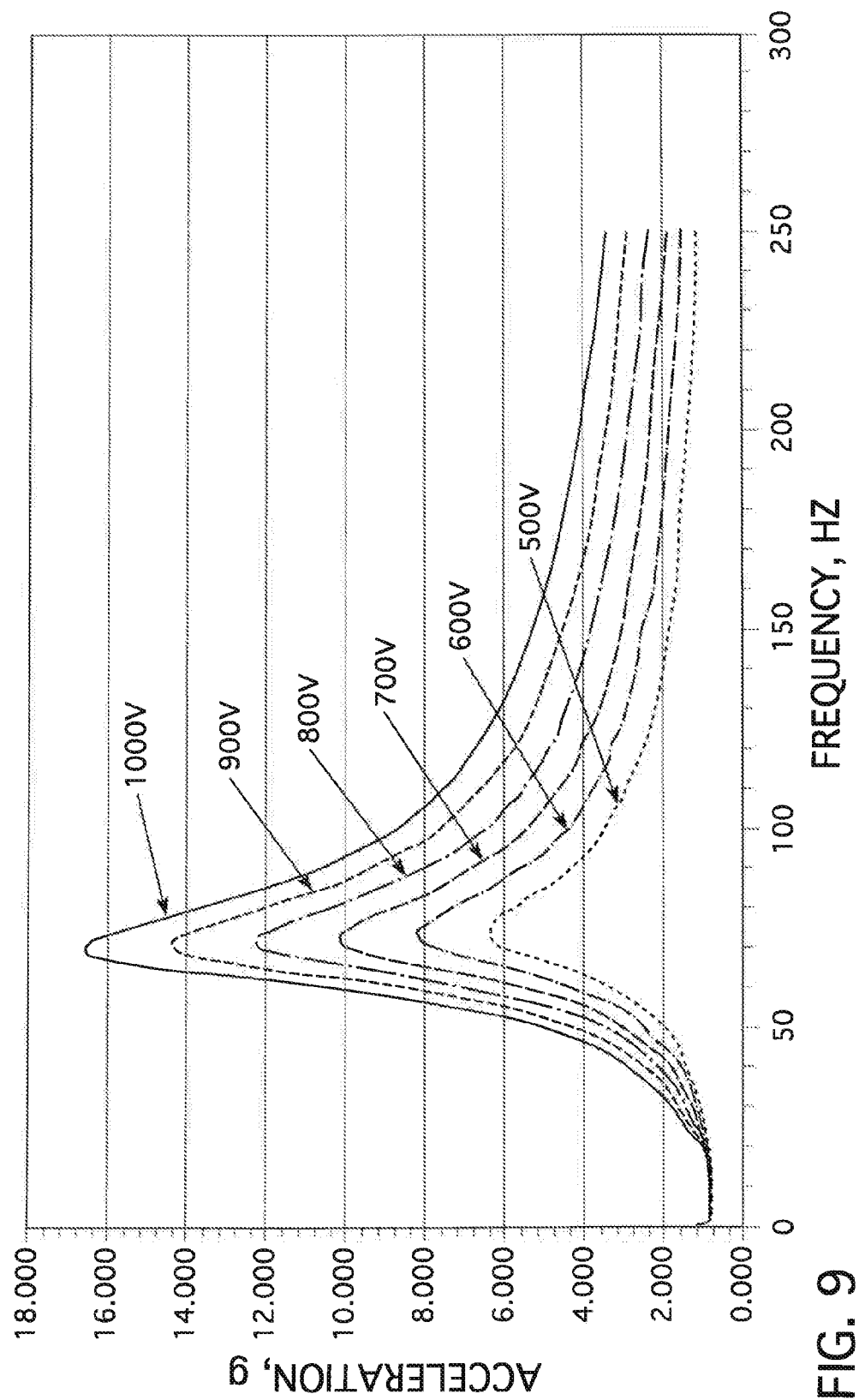
FIG. 9 shows the lower operating voltages possible with devices made by the inventive methods.

As can be appreciated by reference to FIG. 7, the inventive electroactive polymer transducers have 2.5-3× the performance of standard devices. The inventive electroactive polymer transducers require 50% of the active area for the same performance as standard devices as illustrated in FIG. 8. As can be appreciated by reference to FIG. 9, the inventive devices require 60% of the operating field for the same performance as standard electroactive polymer transducers.

Figure 10:
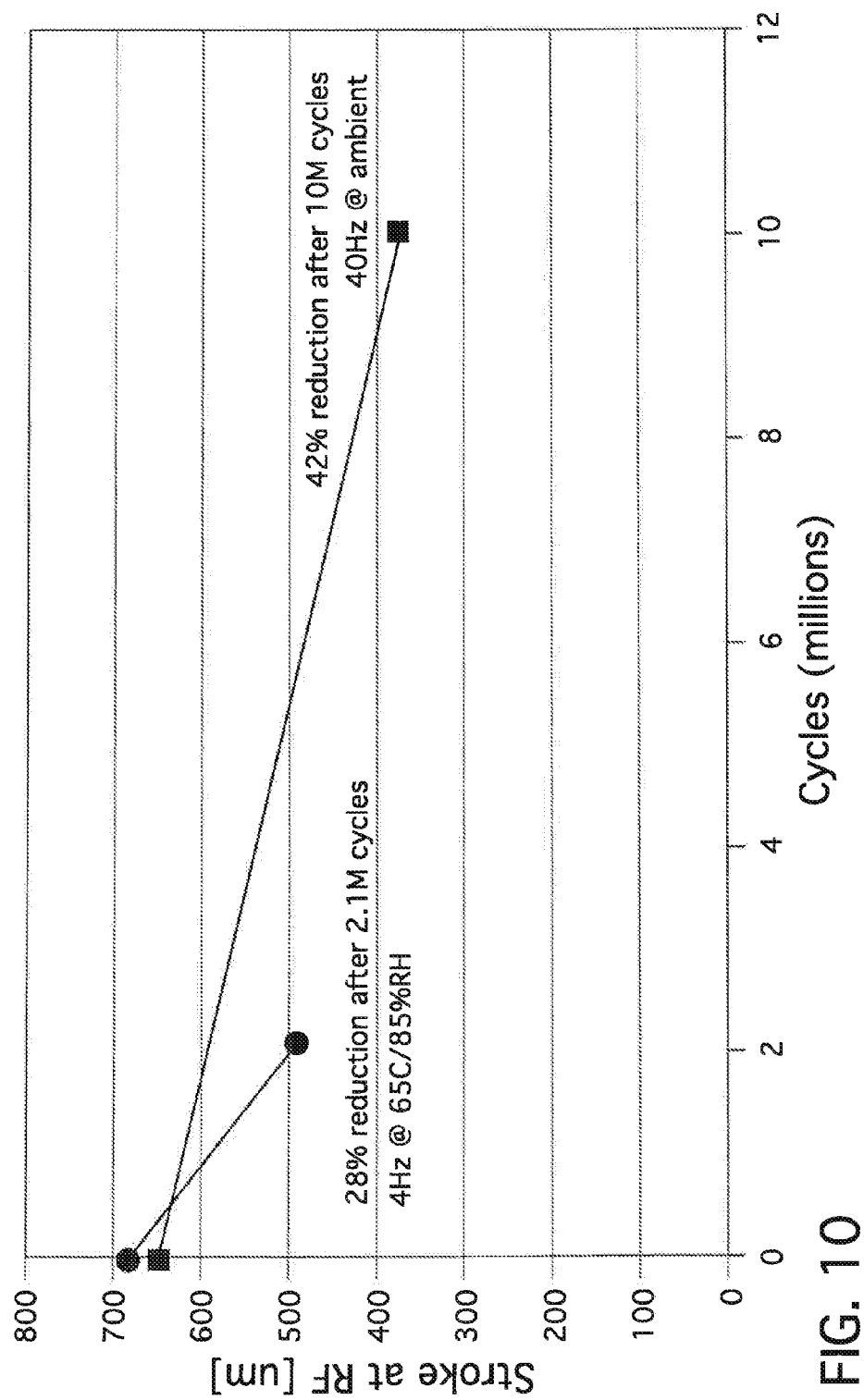
FIG. 10 illustrates the effects of cyclic aging.
Figure 11:
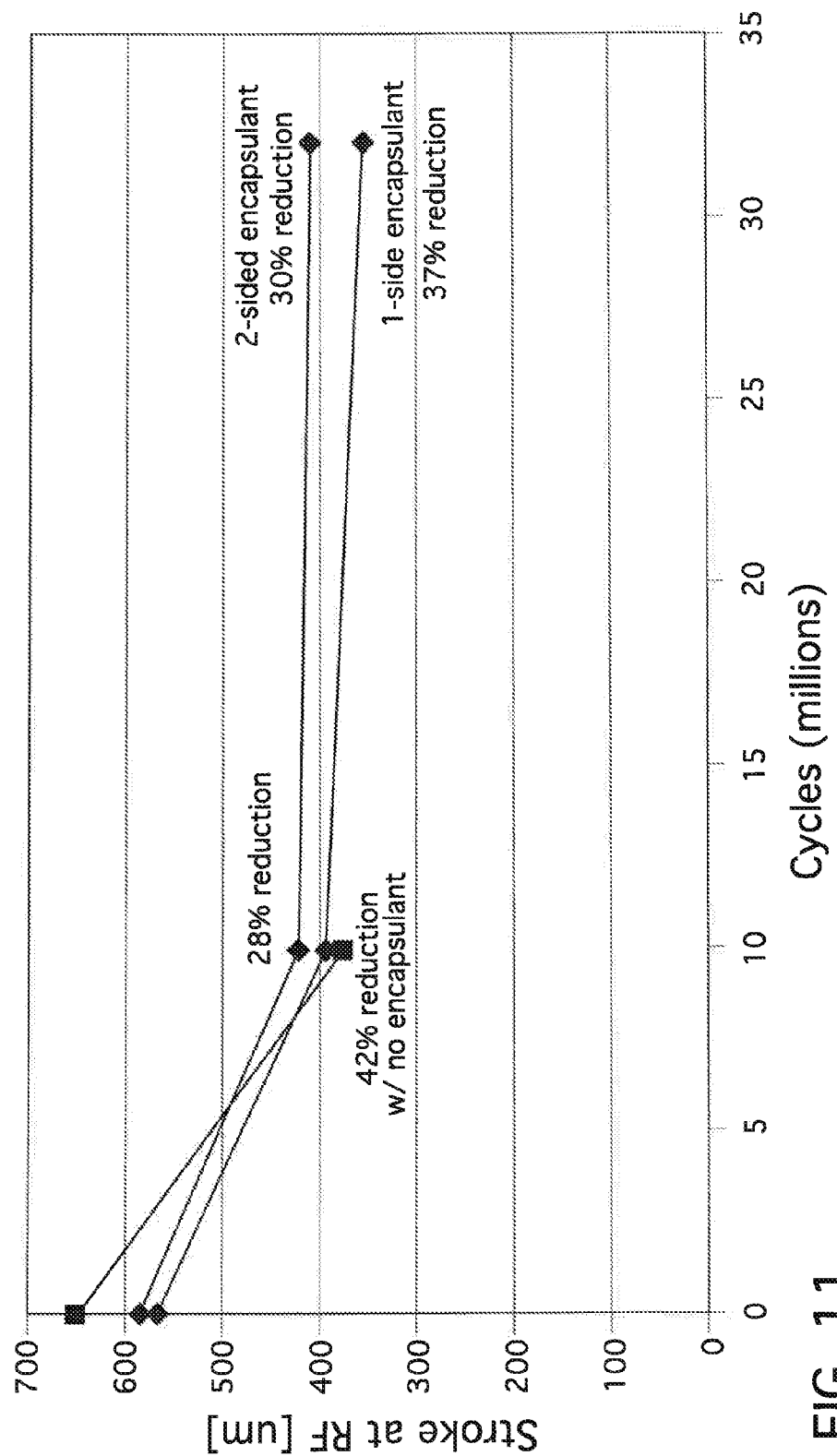
FIG. 11 shows the effect of encapsulation on aging stability.
Figure 12:
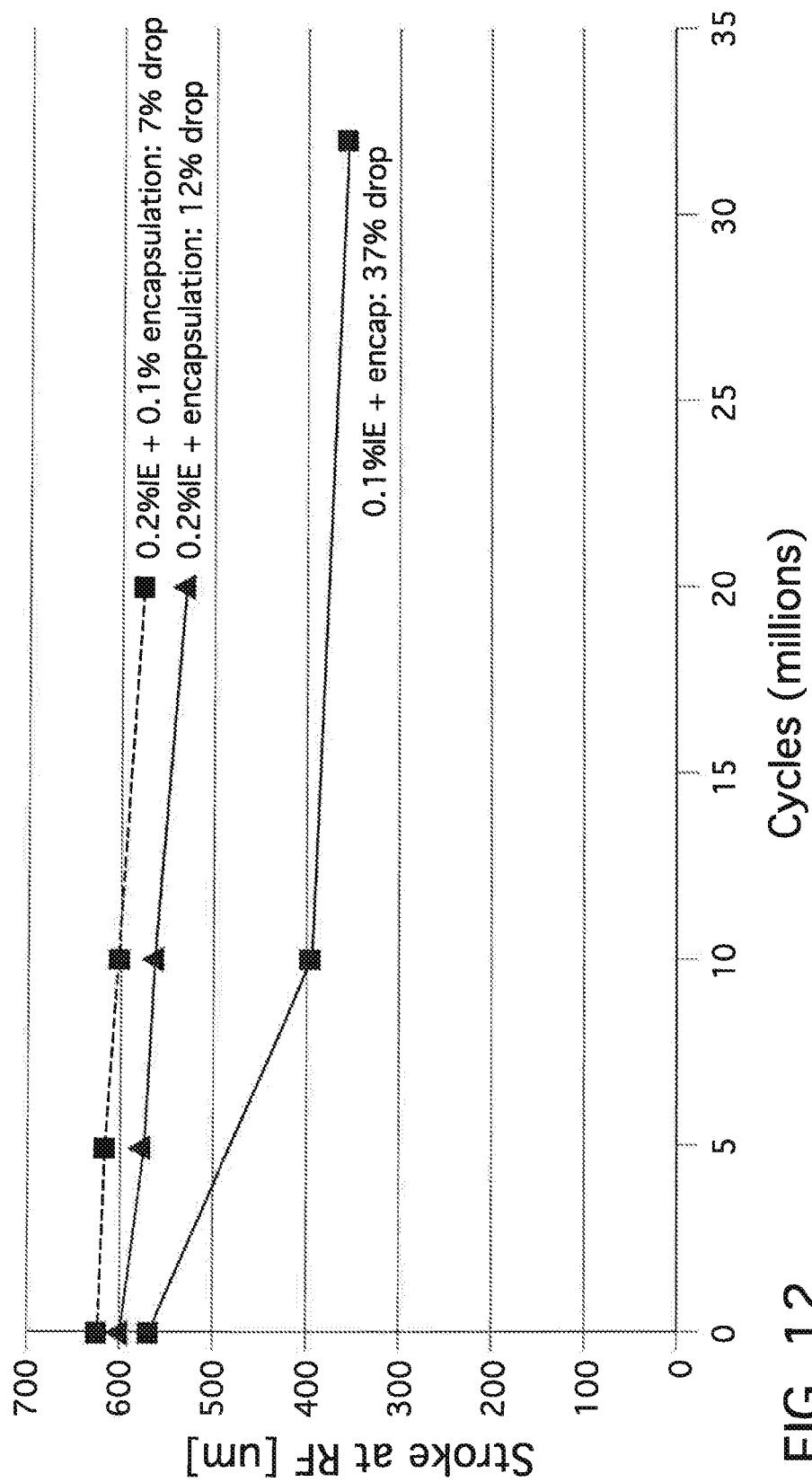
FIG. 12 shows that higher electrically active additive concentrations also improve aging stability.

FIG. 10 shows that cyclic aging of electroactive polymer transducers with enhanced electrodes can degrade performance. Passive aging is less of an issue: 10% reduction after 95 hours at 85° C. or 100 hour at 65° C./85% relative humidity; 20% reduction after 95 hours at 100° C. Encapsulation may improve aging stability as is shown in FIG. 11. Initial performance is ~10% lower, but two-sided encapsulated electroactive polymer transducers show little change after 10 million cycles at ambient conditions. Higher electrically active additive concentrations may also improve aging stability as illustrated in FIG. 12.

Figure 13:
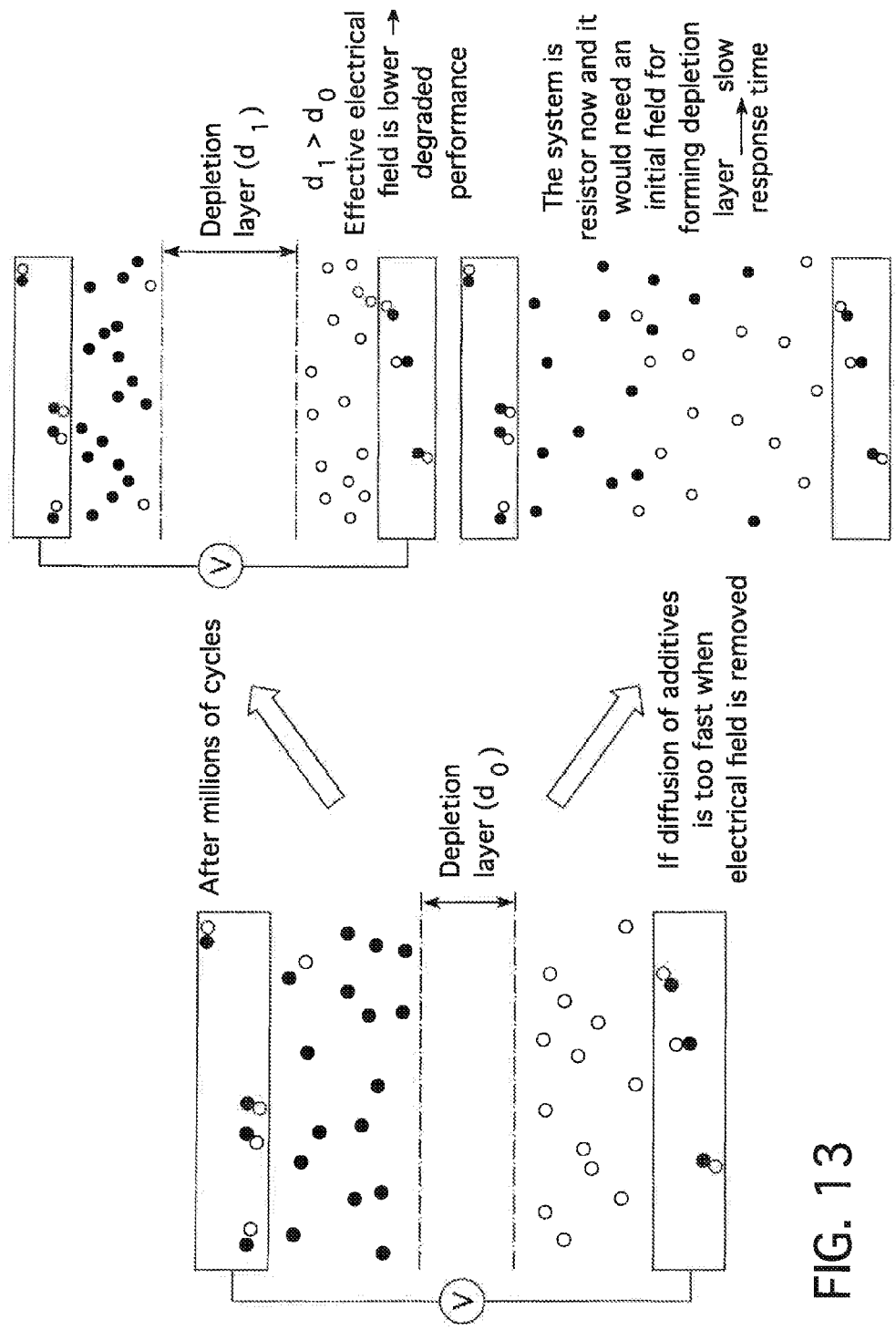
FIG. 13 illustrates the role of diffusion kinetics for reliability and response time.
Figure 14:
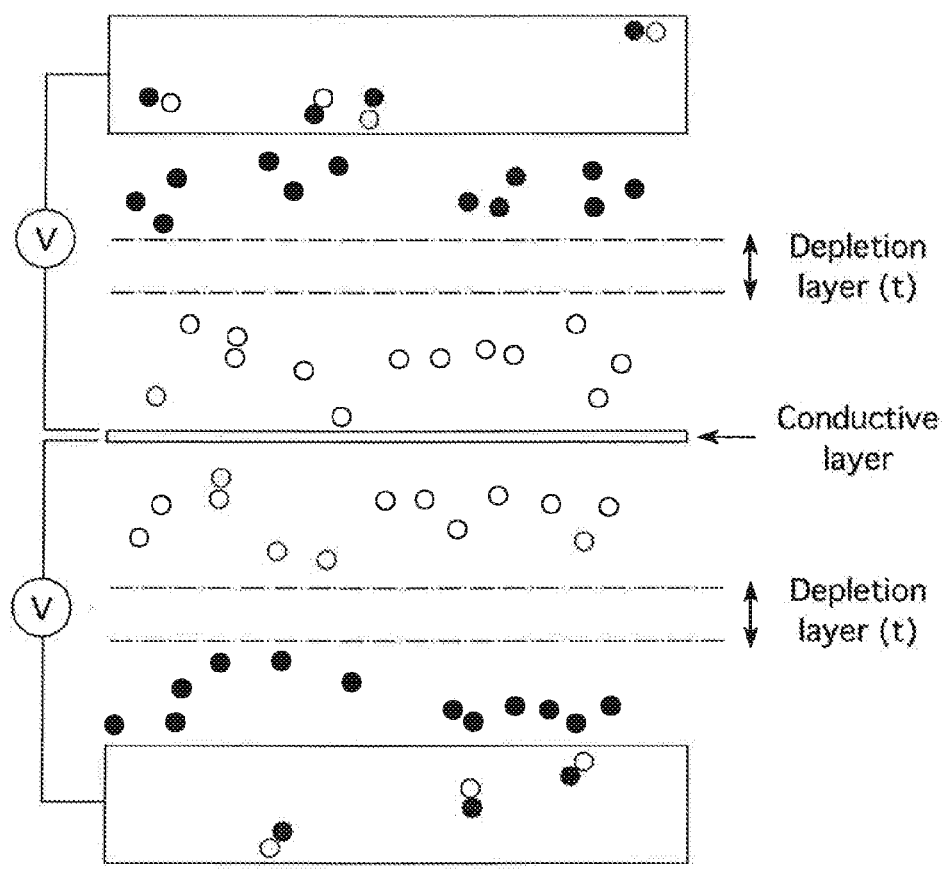
FIG. 14 details a double depletion layer concept for a super electroactive polymer.

FIG. 13 details a double depletion layer concept for a super electroactive polymer. The thickness of the entire structure is the same as current films, but it possesses a multilayer structure with a conductive layer in the middle. When an electric field is imposed between the middle (embedded) conductive layer and the electrodes on the outer surfaces, the effective field is twice as high in each dielectric layer as it would be if the same voltage had been applied across the two outer electrodes of a single dielectric layer with the same overall thickness. In this case, performance can be four times as high as a standard transducer construction as illustrated by the equations below:

$$\text{Stroke} \propto E^2 * \epsilon * \epsilon_o / Y$$

$$\text{Force} \propto E^2 * \epsilon * \epsilon_o * t$$

When the outer electrodes and/or the middle conductive layer are enhanced with electrically active additives, performance is further enhanced by the creation of a depletion layer in each of the dielectric layers. Multilayer stacked devices can be fabricated with more than two embedded conductive layers, some or all of which are enhanced with electrically active additives, although care must be taken to make electrical interconnections to alternating embedded conductive layers.

A benefit of a multilayer structure compared with thinner films is that it can provide the same performance as the current film at significantly lower operating voltages but is much easier to use in manufacturing processes than thinner films. With enhanced electrodes, transducer response should be faster due to shorter diffusion lengths and times for the electrically active additives to form the depletion layers.

Figure 15:
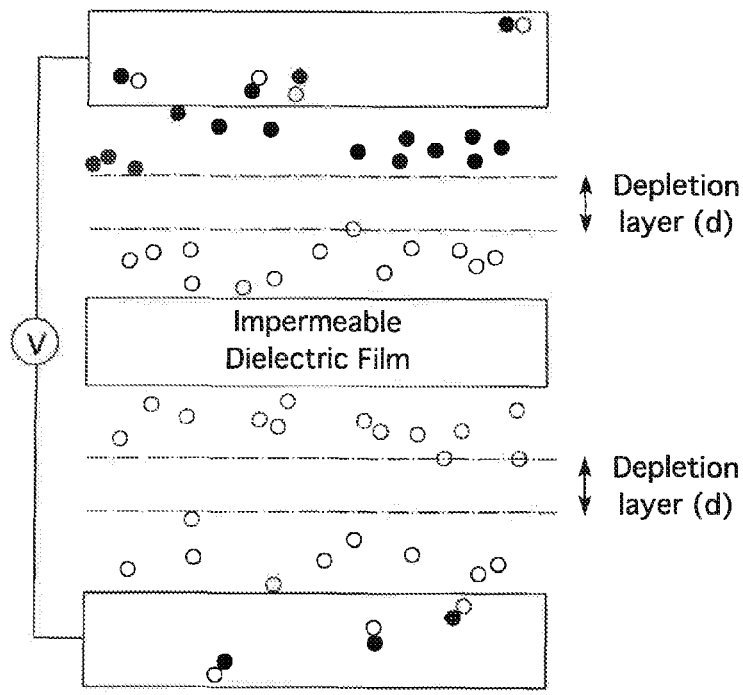
FIG. 15 provides an impermeable middle layer concept for a super electroactive polymer.

FIG. 15 provides an impermeable middle layer concept for a super electroactive polymer. This design includes multilayers having impermeable dielectric layer(s) embedded between dielectric elastomer layers. These impermeable layers are not permeable for the electrically active additives or their fragments which can cause them or space charges to collect on either side of the impermeable dielectric film. The active thickness of the multiple dielectric elastomer layers can be thinner and show higher capacitance than a single layer film of the same overall thickness. Also, if the impermeable dielectric layer is thin and compliant, it can act as an active layer. In some cases, it may not be necessary to add electrically active additives and rely solely on space charge formation. With electrically active additives, one can obtain depletion layers within the thinner dielectric elastomer layers for even greater performance enhancement. Similar to the case of embedded conductive layers, a benefit of this structure is that transducer response times should be improved by the electrically active additive's diffusion kinetics due to shorter diffusion lengths. Further, manufacturing should be easier for the composite film rather than handling individual thinner layers. The electrical interconnections for an impermeable dielectric stack architecture are much simpler since contacts are only needed to the outer electrodes.

Figure 16:
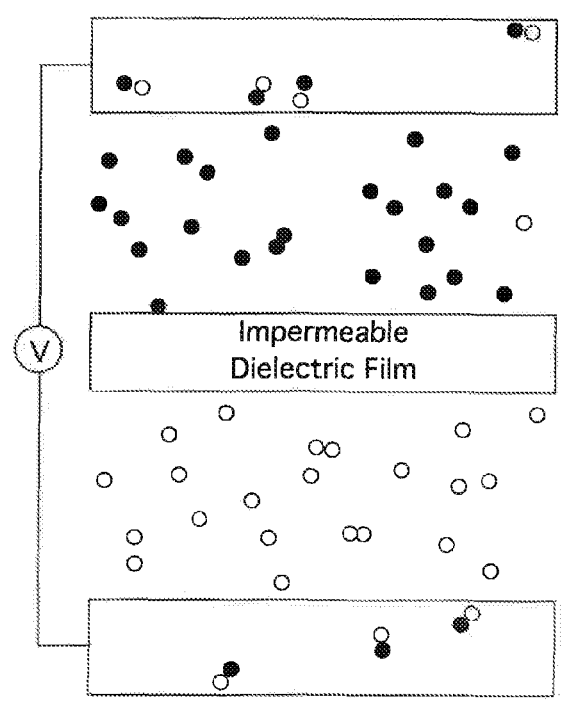
FIG. 16 illustrates a variation of the concept of FIG. 15.

A variation of this concept is shown in FIG. 16 in which the multilayer structure is fabricated and an initial electrical field is applied to separate anions and cations. Then, an impermeable dielectric film is formed to prevent ions from migrating back. A benefit of this structure is that performance and reliability will not be affected by the electrically active additive's diffusion kinetics due to a well-defined embedded dielectric film. The impermeable dielectric film should be sufficiently compliant to serve as the active layer. The multilayer construction would be more complex than that shown in FIG. 15; however, a chemically reactive additive such as electrically active additive I-3 would offer an easier way to make a multilayer as illustrated in FIG. 17.

Figure 17:
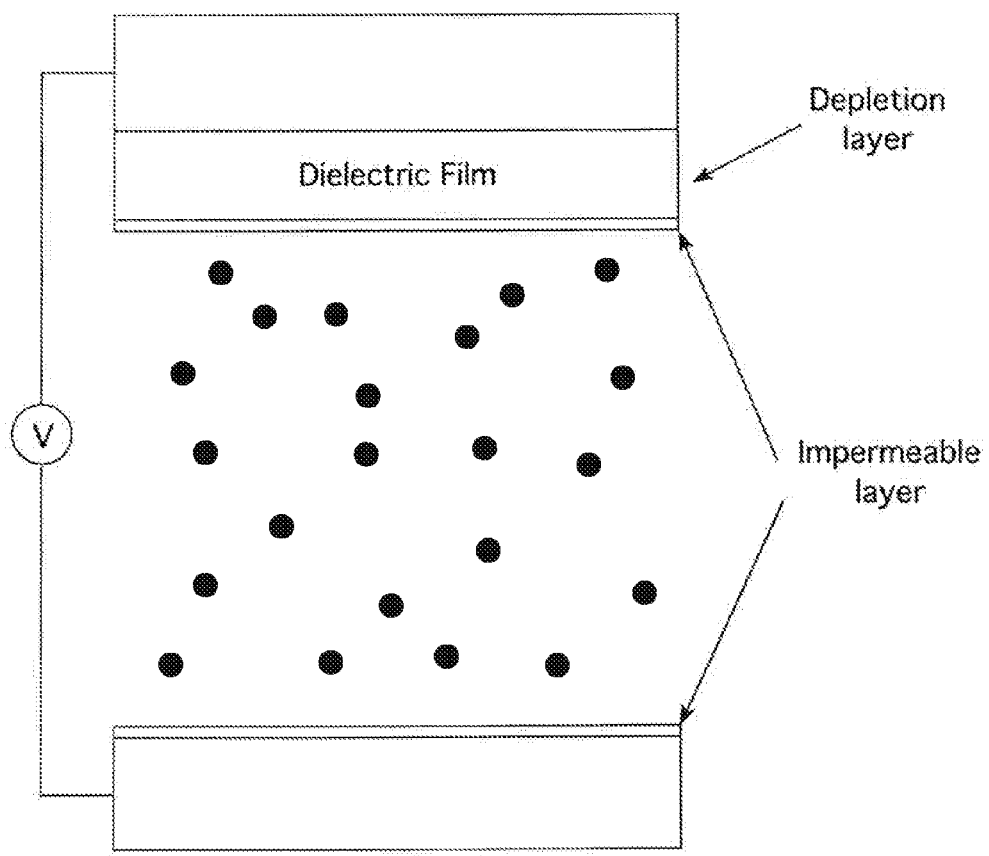
FIG. 17 shows an alternate way to make a multilayer.

In FIG. 17, electrically active additive I-3 is used as a photoinitiator. The film is formed by adding electrically active additive I-3 to the resin and exposed to UV radiation; the cation is decomposed to initiate cationic polymerization of the resin and only anion can remain. With plasma treatment or surface moieties that can form a more dense structure, very thin impermeable layers are formed as illustrated in FIG. 19. In addition, a thin dielectric film can be coated which acts as a depletion layer. The UV formed film, dielectric film and impermeable layer should be compliant. For this structure, an electrode without additives may be deposited. Because it has the same thickness as the current film (UV formed film+dielectric film), it will have the same force as a single layer actuator with the same overall thickness.

FIG. 18 details how to make a multilayer transducer having an embedded impermeable dielectric film. FIG. 19 illustrates methods to make an impermeable layer.

Figure 20:
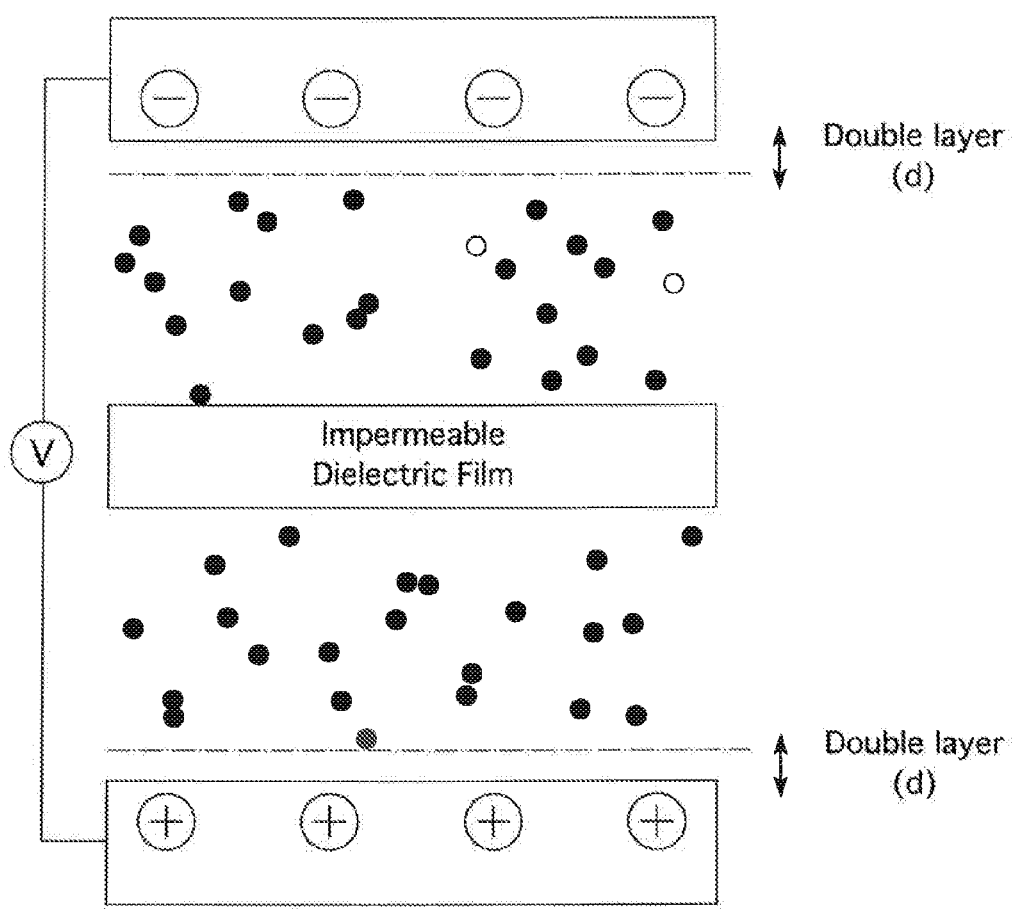
FIG. 20 provides a double layer concept for a super electroactive polymer.

FIG. 20 provides a double layer concept for a super electroactive polymer. Those skilled in the art know that Electrochemical Double Layer Capacitors (EDLCs) also called supercapacitors (SC) are constructed from two carbon based electrodes (mostly activated carbon with a very high surface area), an electrolyte (aqueous or organic) and a separator (that allows the transfer of ions, but provides electronic insulation between the electrodes). As voltage is applied, ions in the electrolyte solution diffuse across the separator into the pores of the electrode of opposite charge. Charge accumulates at the interface between the electrodes and the electrolyte (the double layer phenomenon that occurs between a conductive solid and a liquid solution interface), and forms two charged layers with a separation of several angstroms (d in FIG. 20). The double layer capacitance is the result of charge separation in the interface. Because capacitance is proportional to the surface area and the reciprocal of the distance between the two layers, high capacitance values are achieved. (http://www.cellergycap.com/index.php?option=com_content&view=article&id=17&Itemid=3). This supercapacitor concept may be applied to the instant invention to provide a super actuator as illustrated in FIG. 20. The benefit of double layer to depletion layer will be higher capacitance and faster response time due to short diffusion length.

The foregoing examples of the present invention are offered for the purpose of illustration and not limitation. It will be apparent to those skilled in the art that the embodiments described herein may be modified or revised in various ways without departing from the spirit and scope of the invention. The scope of the invention is to be measured by the appended claims.

What is claimed is:

1. A transducer film comprising:
 a dielectric elastomer material;
 an electrode material on at least one side of the dielectric elastomer material; and
 at least one electrically active additive, wherein the at least one electrically active additive is configured to diffuse through the dielectric elastomer material upon the application of an electric field.

2. The transducer film of claim 1 further comprising an encapsulant material.

3. The transducer film of claim 1, wherein the electrically active additive is a component of the electrode material.

4. The transducer film of claim 2, wherein the electrically active additive is a component of the encapsulant material.

5. The transducer film of claim 1, wherein the electrode material is on both sides of the dielectric elastomer material.

6. The transducer film of claim 1, wherein the electrically active additive comprises one or more compounds selected from the group consisting of ionic salts, iodonium salts and sulfonium salts.

7. The transducer film of claim 1, wherein the electrically active additive comprises one or more compounds selected from the group consisting of (4-tert-Butylphenyl) diphenyl sulfonium triflate, Tris(pentafluorophenyl) boron, 4-isopropyl-4'-methyldiphenyliodonium tetrakis(pentafluorophenyl) borate, Sodium tetraphenylborate, sodium tetrakis[3,5-bis(trifluoromethyl) phenyl]borate, bis(4-tert-butylphenyl) iodonium triflate, tris({4-[(4-acetylphenyl)sulfanyl]phenyl})sulfanium tetrakis(pentafluorophenyl)borate, sodium chloride and a phthalocyanine.

8. The transducer film of claim 1 further comprising at least one additional dielectric elastomer layer separated from the dielectric elastomer material by a separating layer.

9. The transducer film of claim 8, wherein the separating layer is a conductive material.

10. A transducer device comprising the transducer film of claim 1.

11. A method for fabricating the transducer device of claim 10 comprising a photo- or thermal treatment after application of the electrically active additive.

12. A transducer film comprising:
- a dielectric elastomer material;
- an electrode material on at least one side of the dielectric elastomer material;
- at least one electrically active additive; and
- at least one additional dielectric elastomer layer separated from the dielectric elastomer material by a separating layer wherein the separating layer is an impermeable dielectric layer that is not permeable to charges or ions.

* * * * *